United States Patent [19]

Savage

[11] 4,456,976

[45] Jun. 26, 1984

[54] ASSOCIATIVE MEMORY SYSTEM

[75] Inventor: Patric Savage, Brookshire, Tex.

[73] Assignee: Shell Oil Company, Houston, Tex.

[21] Appl. No.: 373,068

[22] Filed: Apr. 29, 1982

[51] Int. Cl.³ ............................................. G11C 15/00
[52] U.S. Cl. ........................................ 365/49; 364/900
[58] Field of Search ...................... 365/49, 50; 364/900

[56] References Cited

U.S. PATENT DOCUMENTS 4,385,371 5/1983 Shafer .................................. 365/49

Primary Examiner—Terrell W. Fears

[57] ABSTRACT

An associative memory system for retrieving a key word related to a code word comprising a first random access memory which can be read from and written into and is sized to accommodate at least m address-bits and a second random access memory means which can be read from and written into and is sized to accommodate at least (n+p) address-bits. An addressing means is connected to the first and second memory means for providing a first portion of m bits of the code word to the first memory means and a second portion of n bits of the code word to the second memory means. The first memory means is adapted to provide a response word of p bits to the second memory means if the first memory means determines that the first portion of the code word corresponds to a word stored in said first memory means. The second memory means is adapted to provide the key word on an output line if the second memory means determines that a combination of the n and p bits corresponds to a word stored in said second memory means.

4 Claims, 1 Drawing Figure

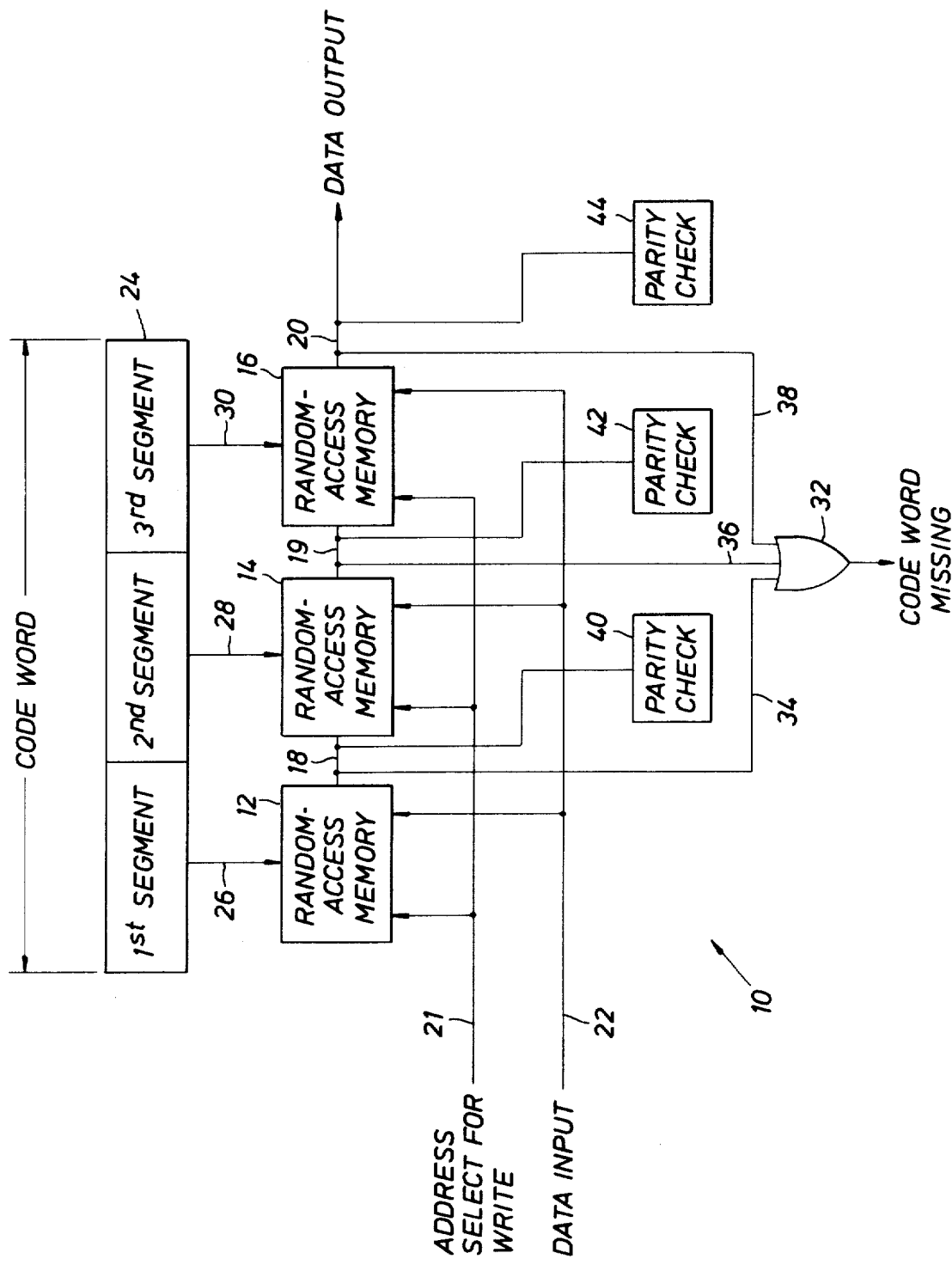

ASSOCIATIVE MEMORY SYSTEM

BACKGROUND OF THE INVENTION

Associative or content-addressable memories are utilized for making a high-speed search for a specific word in a cache memory or buffer storage, which temporarily stores part of the information of the main memory. For example, in an array processor a subroutine is known by a specific identifier code. At any juncture it is possible to hold only a limited number of different subroutines within the array processor. When an executing program calls a subroutine, it is important to be able to quickly obtain access to a table entry that describes and/or controls the called subroutine or to determine that it is absent from the array processor and to invoke a procedure to obtain the needed subroutine from the main memory.

Therefore, it is an object of the present invention to provide an associative memory system that provides a key word, such as a pointer address, in response to a code word that is presented to it for association.

SUMMARY OF THE INVENTION

In accordance with the present invention there is provided an associative memory system for retrieving a key word related to a code word. The memory system comprises a first random access memory means which can be read from and written into and is sized to accommodate at least m address-bits and a second random access memory which can be read from and written into and is sized to accommodate at least (n+p) address-bits. An addressing means is connected to the first and second memory means for providing a first portion of m bits of the code word to the first memory means and a second portion of n bits of the code word to the second memory means. The first memory means is adapted to provide a response word of p bits to the second memory means if the first memory means determines that the first portion of the code word corresponds to a word stored in the first memory means. The second memory means is adapted to provide the key word on an output line if the second memory means determines that a combination of the n and p bits corresponds to a word stored in the second memory means.

The associative memory system of the present invention can store the associated key words for a predetermined number of code words provided that every code word can be specified in a constant number of bits. The memory system utilizes a plurality of random access memories in a cascade arrangement such that at least part of the response from the first memory is used to address a second memory, at least part of the response of the second memory is used to address a third memory, and so forth. The last memory in the cascade presents a key word response which is information associated with the code word and which can specify where additional information associated with the code word can be found. A code word, which has a discrete number of bits that have been partitioned into segments for addressing the memories, is presented to the memory system of the present invention. A first portion of the code word is presented to the first memory, a second portion of the code word is presented to the second memory and so forth. If the first portion of the code word is identical to the first portion of any code word that is currently registered in the associative memory, the first memory provides an associated response word to the second memory where it is combined or concatenated with the second portion of the code word that has been presented to the second memory. If the first two portions of the code word, taken together, are identical to the same portions of any code word that is currently registered in the associative memory, the second memory provides an associated response word to the third memory which is combined with the portion of the code word that has been provided to the third memory, and so forth. If all of the portions of the code word provided to the memory system are found, the last memory in the cascade of memories provides the desired key word, that is, for example, the entry in a subroutine table that contains the descriptive and/or control information that is the practical object of the association request. The final memory in the cascade can be of any width, and if some element of the association is needed as soon as possible, the final memory can be made large enough to store it directly. The first portion of the code word should be larger in number of bits than the base 2 logarithm of the maximum number of different first-portion code words that can be concurrently registered in the associative memory; otherwise, the first memory would be unnecessary. Similarly, the combined number of bits used to address all of the cascaded memories, except the final memory, should exceed the number of bits in the response word, which normally will be the base 2 logarithm of the maximum number of different code words that can ever be registered concurrently.

In any implementation of the memory system of the present invention, the first memory is the only one that requires full access time, since all of the other memories can be partially preaddressed. The time delay associated with each of the other memories is related only to the settling time required for the associated response word bit-string coming from the previous memory. The parallel addressing reduces the overall time required for association. The memory system of the present invention provides the desired key word in a fixed response time, that is, the requested information is returned in the same length of time for all code words that are stored in the memory system. In addition, the present invention allows the speed of association to be traded off against hardware in a straightforward manner.

Other objectives, advantages and applications of the present invention will be made apparent by the following detailed description of the preferred embodiments of the present invention.

BRIEF DESCRIPTION OF THE DRAWINGS

The FIGURE is a functional block diagram illustrating an associative memory system according to the present invention.

DETAILED DESCRIPTION OF THE PREFERRED EMBODIMENTS

Referring to the FIGURE, an associative memory system according to the present invention is indicated generally by numeral 10. Memory system 10 comprises three random access memories, 12, 14 and 16, which are connected such that the output of memory 12 is provided to memory 14 by line 18 and the output 14 is provided to memory 16 by line 19. The output of memory system 10 is provided on line 20 from memory 16. The address select for writing data into memories 12, 14 and 16 is provided on line 21, and the data to be written into the memories is provided by line 22. The symbolic label or code word that is presented to memory system 10 for association is indicated by block 24. Code word 24 can be of any length provided that for each embodiment it consists of a constant number of bits that are sufficient to code the maximum number of pieces of information. Code word 24 is partitioned into segments so that the number of segments is equal to the number of cascaded memories in memory system 10, which is three in the embodiment shown in the FIGURE; these segments can be any number of bits in length provided that the length is constant for each embodiment. For example, if code word 24 is 20 bits and the maximum number of possible code words that can be registered at one time is 256, code word 24 can be partitioned into a 12 bit first segment and four bit second and third segments with the response words from memories 12 and 14 being 8 bits each. The first segment of code word 24 is provided to memory 12 on line 26. The second segment is provided to memory 14 on line 28, and the third segment is provided to memory 16 on line 30. Each of memories 12, 14 and 16 provides a separate bit in its output which indicates if a correspondence has not been found, since in that case any other information in the output is irrelevant. The bits which are indicative of the nonavailability of the information requested are provided to OR logic gate 32 by lines 34, 36 and 38 for memories 12, 14 and 16 respectively. The first memory in the cascade that does not find a correspondence provides a high signal to gate 32 which provides a signal to indicate that a segment of code word 24 has been found to be missing. In addition, parity checks 40, 42 and 44 are provided, as is known in the art, to assure the accuracy of the outputs on lines 18, 19 and 20.

The operation of memory system 10 can be described as follows. The first, second and third segments of code word 24 are presented to memories 12, 14 and 16 on lines 26, 28 and 30 respectively in parallel. If a correspondence for the first segment of code word 24 is found in memory 12, the associated response word is provided to memory 14 on line 18. The second segment of code word 24 indicates a particular section of memory 14, and the response word from memory 12 specifies which entry within that particular section of memory 14. If a correspondence for the combination of the associated word from memory 12 and the second segment of code word 24 is found in memory 14, the associated response word is provided to memory 16 on line 19. The third segment of code word 24 selects a section of memory 16 and the associated word from memory 14 specifies which entry within that section of memory 16. If a correspondence for the combination of the response word from memory 14 and the third segment of code word 24 is found in memory 16, the information stored therewith, which is the information associated with code word 24, for example, a pointer to the location in another memory which contains the actual control word for the subroutine associated with code word 24, is provided on line 20. The accuracy of the outputs of memories 12, 14 and 16 are checked by parity checks 40, 42 and 44 respectively. If the first segment of code word 24 was not found in memory 12, or if the combination of the response word from memory 12 and the second segment of code word 24 is not found in memory 14, or if the combination of the response word from memory 14 and the third segment of code word 24 is not found in memory 16, the appropriate memory provides a high bit to gate 32. In response to the high bit gate 32 passes a high signal to initiate a procedure for obtaining the desired subroutine from main memory, as is known in the art. If desired, the high signal can initiate a procedure to delete the information associated with one of the subroutines that is stored in memory system 10 and to replace it with the information associated with the missing subroutine so that it is available for future reference, as is known in the art.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the foregoing disclosure.

What is claimed is:

1. An associative memory system for retrieving a key word related to a code word, said memory system comprising: a first random access memory means which can be read from and written into and is sized to accommodate at least m address-bits; a second random access memory means which can be read from and written into and is sized to accommodate at least (n+p) address-bits; and addressing means connected to said first and second memory means for providing a first portion of m bits of said code word, to said fist memory means and a second portion of n bits of said code word to said second memory means, said first memory means being adapted to provide a response word of p bits to said second memory means if said first memory means determines that said first portion of said code word corresponds to a word stored in said first memory means and said second memory means is adapted to provide said key word on an output line if said second memory means determines that a combination of said n and p address-bits corresponds to a word stored in said second memory means.

2. An associative memory system as recited in claim 1, wherein said associative memory system is adapted to store a predetermined maximum number of code words and associated key words, said predetermined maximum number of code words being capable of being addressed in p address-bits, and said m being greater than said p.

3. An associative memory system as recited in claims 1 or 2 further comprising a first means connected to said first memory means to indicate when said m bits do not correspond to a word that is stored in said first memory means and a second means connected to said second memory means to indicate when said combination of n and p bits do not correspond to a word that is stored in said second memory means.

4. An associative memory system as recited in claim 3, wherein said m bits of said first portion and said n bits of said second portion of said code word comprises the total number of bits in said code word.

* * * * *